United States Patent
Usami et al.

(10) Patent No.: US 7,473,630 B2
(45) Date of Patent: Jan. 6, 2009

(54) SEMICONDUCTOR DEVICE AND METHOD FOR MANUFACTURING SAME

(75) Inventors: Tatsuya Usami, Kanagawa (JP); Noboru Morita, Kanagawa (JP); Koichi Ohto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 279 days.

(21) Appl. No.: 11/542,212

(22) Filed: Oct. 4, 2006

(65) Prior Publication Data

US 2007/0032070 A1 Feb. 8, 2007

Related U.S. Application Data

(62) Division of application No. 11/219,784, filed on Sep. 7, 2005, now Pat. No. 7,135,776.

(30) Foreign Application Priority Data

Sep. 22, 2004 (JP) ............................ 2004-276038

(51) Int. Cl.
*H01L 21/20* (2006.01)
*H01L 21/44* (2006.01)

(52) U.S. Cl. .................. 438/618; 438/624; 438/637; 438/697; 438/706; 438/711; 257/E21.257; 257/E21.267; 257/E21.293; 257/E21.304; 257/E21.576

(58) Field of Classification Search ................ 438/618, 438/624, 637, 638, 697, 706, 711, 723, 724, 438/738, 949; 257/E21.257, 267, 293, 304, 257/576, 577, 583, 589
See application file for complete search history.

(56) References Cited

U.S. PATENT DOCUMENTS 5,886,410 A * 3/1999 Chiang et al. ............ 257/759

| RE36,644 | E | * | 4/2000 | Dennison | ............... 438/396 |
|---|---|---|---|---|---|
| 6,051,508 | A | | 4/2000 | Takase et al. | |
| 6,127,070 | A | * | 10/2000 | Yang et al. | ............... 430/5 |
| 6,143,646 | A | * | 11/2000 | Wetzel | ............... 438/637 |
| 6,271,127 | B1 | * | 8/2001 | Liu et al. | ............... 438/638 |
| 6,380,073 | B1 | * | 4/2002 | Hwang et al. | ............... 438/637 |
| 6,424,038 | B1 | * | 7/2002 | Bao et al. | ............... 257/741 |
| 6,583,043 | B2 | * | 6/2003 | Shroff et al. | ............... 438/618 |
| 6,680,258 | B1 | * | 1/2004 | Tsai et al. | ............... 438/706 |
| 6,929,982 | B2 | * | 8/2005 | Gates et al. | ............... 438/118 |
| 7,253,098 | B2 | * | 8/2007 | Chen et al. | ............... 438/637 |
| 2001/0017422 | A1 | | 8/2001 | Oda | |
| 2004/0183164 | A1 | | 9/2004 | Usami | |

FOREIGN PATENT DOCUMENTS

JP 2001-102449 4/2001

* cited by examiner

*Primary Examiner*—Michael S Lebentritt
(74) *Attorney, Agent, or Firm*—Young & Thompson

(57) ABSTRACT

A technology for inhibiting the dielectric breakdown occurred in a semiconductor device is provided. A semiconductor device includes a semiconductor substrate (not shown), an interlayer insulating film 102 formed on the semiconductor substrate and a multiple-layered insulating film 140 provided on the interlayer insulating film 102. The semiconductor device also includes an electric conductor that extends through the multiple-layered insulating film 140 and includes a Cu film 120 and a barrier metal film 118. The barrier metal film 118 is covers side surfaces and a bottom surface of the Cu film 120. An insulating film 116 is disposed between the multiple-layered insulating film 140 and the electric conductor (i.e., Cu film 120 and barrier metal film 118).

7 Claims, 8 Drawing Sheets

SEMICONDUCTOR DEVICE AND METHOD FOR MANUFACTURING SAME

BACKGROUND OF THE INVENTION

1. Field of the Invention

The present invention relates to a semiconductor device and a manufacturing method thereof.

2. Related Art

Conventional semiconductor devices includes, for example, semiconductor devices described in Japanese Patent Laid-Open No. 2001-102,449. Cross-sectional views of the semiconductor devices described in Japanese Patent Laid-Open No. 2001-102,449 are shown in FIGS. 12A and 12B. As show in FIG. 12A, concerning a base layer 201 employed for manufacturing such semiconductor device, an electrode 400 is formed on the surface of the base layer 201, and a periphery of the electrode 400 is covered with an insulating layer 401, and is planarized.

Then, as shown in FIG. 12B, an $Si_3N_4$ layer 202, an organic spin-on-glass (SOG) film 203, an $Si_3N_4$ layer 204, an organic SOG film 207 and an $Si_3N_4$ layer 208 are sequentially deposited on the base layer 201, and trenches and holes are integrally formed via a dual damascene etch process. Then, Cu is embedded within these trenches and holes as an electric conductor layer 402 to form an interconnect circuit, thereby presenting the semiconductor device.

However, there are interfaces between the organic SOG film 203 and 207 that are low dielectric constant insulating films and the etch stop film that is an underlying layer film or $Si_3N_4$ layers 202, 204 and 208 that function as hard mask films of the upper layer films in the conventional technology described in Japanese Patent Laid-Open No. 2001-102,449, and the interfaces contact with the electric conductor layer 402.

In this structure, when time dependence dielectric breakdown (TDDB) is conducted between interconnects in the case that the interval between interconnects that are composed of portions of the electric conductor layer 402 (i.e., interval between the electric conductor layers 402) is narrow, a dielectric breakdown is occurred through these interfaces, so that a short-circuit between the interconnects composed of portions of the electric conductor layer 402 is occurred. This phenomenon becomes to be noticeable, as the dielectric constants of the organic SOG films 203 and 207, which are low dielectric constant insulating films, are reduced.

SUMMARY OF THE INVENTION

The present invention has been provided in view of the above-described situations, and the present invention provides a technology that provides an inhibition to the dielectric breakdown occurred in the semiconductor devices.

According to one aspect of the present invention, there is provided a semiconductor device, comprising: a semiconductor substrate; a multiple-layered insulating film provided on an upper portion of the semiconductor substrate; an electric conductor containing copper or copper alloy the electric conductor being provided so as to extend through the multiple-layered insulating film; and an insulating film provided between the multiple-layered insulating film and the electric conductor, wherein the multiple-layered insulating film includes a first insulating layer, a second insulating layer and a third insulating layer, the second insulating layer being provided on the first insulating layer and having lower dielectric constant than the dielectric constant of the first insulating layer, the third insulating layer being provided on the second insulating layer and having higher dielectric constant than the dielectric constant of the second insulating layer, and wherein the insulating film provides an isolation of the electric conductor from an interface between the first insulating layer and the second insulating layer, and provides an isolation of the electric conductor from an interface between the second insulating layer and the third insulating layer.

According to such configuration, the insulating film is configured to isolate the electric conductor from the interface between the first insulating layer and the second insulating layer, and to isolate the electric conductor from the interface between the second insulating layer and the third insulating layer, so that generations of a short-circuit between these interfaces and the electric conductor are inhibited. As a result, a dielectric breakdown, which may be otherwise occurred in the semiconductor device, can be inhibited.

According to another aspect of the present invention, there is provided a method for manufacturing a semiconductor device, comprising: forming on an upper portion of the semiconductor substrate a multiple-layered insulating film that includes a first insulating layer, a second insulating layer and a third insulating layer, the second insulating layer being provided on the first insulating layer and having lower dielectric constant than the dielectric constant of the first insulating layer, the third insulating layer being provided on the second insulating layer and having higher dielectric constant than the dielectric constant of the second insulating layer; forming an insulating film by forming an opening, which extends through the multiple-layered insulating film, and covering a portion of a side surface of the opening in vicinity of an interface between the first insulating layer and the second insulating layer and a portion of a side surface of the opening in vicinity of an interface between the second insulating layer and the third insulating layer; and forming an electric conductor containing copper or copper alloy on a portion inside of the insulating film within the opening so as to extend through the multiple-layered insulating film.

According to such configuration, the insulating film that covers a portion in vicinity of an interface between the first insulating layer and the second insulating layer and a portion in vicinity of an interface between the second insulating layer and the third insulating layer, so that generations of a short-circuit between these interfaces and the electric conductor are inhibited. As a result, a dielectric breakdown occurred in the semiconductor device can be inhibited.

Since the configuration having the insulating film formed thereon that covers the interface between the first insulating layer and the second insulating layer and the interface between the second insulating layer and the third insulating layer is employed according to the present invention, the semiconductor device that provides an inhibition to the dielectric breakdown is presented.

BRIEF DESCRIPTION OF THE DRAWINGS

The above and other objects, advantages and features of the present invention will be more apparent from the following description taken in conjunction with the accompanying drawings, in which.

Figure 1:
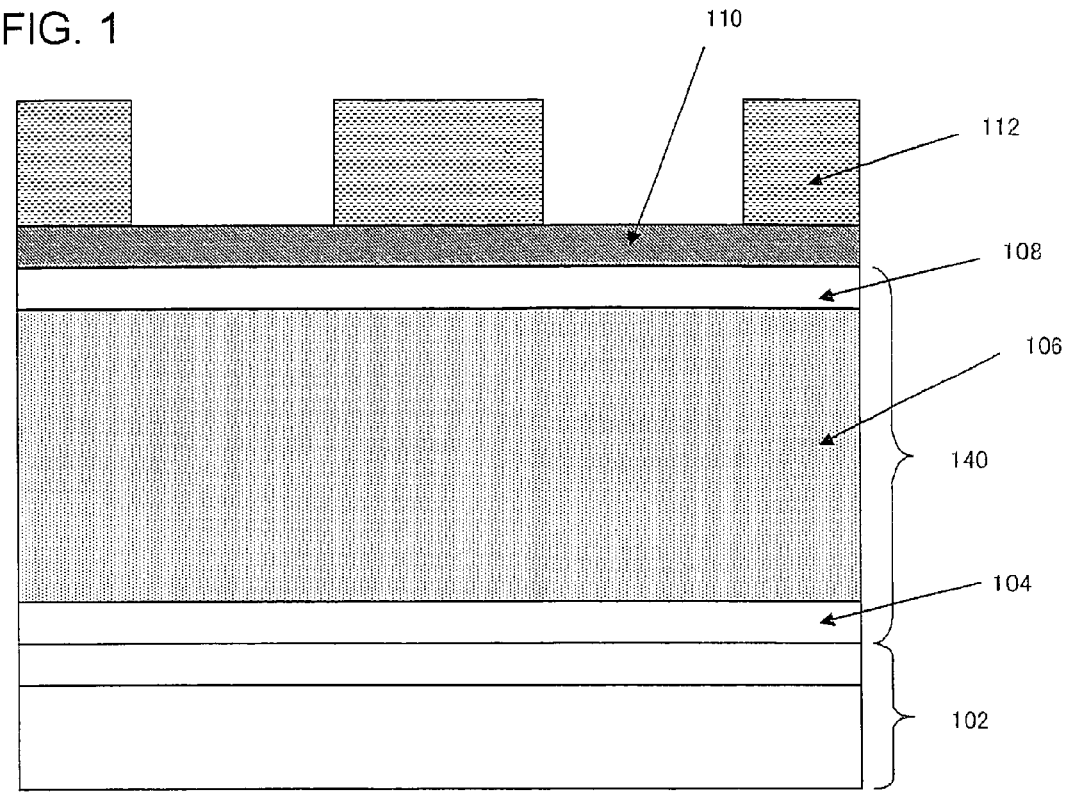
FIG. 1 is a cross-sectional view, useful for describing the method for manufacturing the semiconductor device according to embodiment 1.

In these drawings, the symbols have the following meanings; 102: interlayer insulating film, 104: etch stop film, 106: low dielectric constant insulating film, 108: hard mask film, 110: ARC film, 112: photo resist film, 114: opening, 116: insulating film, 118: barrier metal film, 120: Cu film, 122: copper diffusion protection film, 124: insulating film, 126 barrier metal film, 128: Cu film, 130: etch stop film, 132: low dielectric constant insulating film, 134: hard mask film, 136: Cu film, 140: multiple-layered insulating film, 142: multiple-layered insulating film, 201: base layer, 202 $Si_3N_4$ film, 203: organic SOG film, 204: $Si_3N_4$ film, 207: organic SOG film, 208: $Si_3N_4$ film, 400: electrode, 401: insulating layer, 402: electric conductor layer.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In the present invention, the above-described insulating film may be configured to have a relationship with the multiple-layered insulating film, so that the insulating film extends through the second insulating layer and the third insulating layer and is embedded within at least a portion of the first insulating layer.

According to such configuration, the insulating film can continuously cover a portion in vicinity of an interface between the first insulating layer and the second insulating layer and a portion in vicinity of an interface between the second insulating layer and the third insulating layer. Thus, a dielectric breakdown occurred in the semiconductor device can be inhibited with an improved efficiency.

In the present invention, the above-described insulating film may be configured to extend through the multiple-layered insulating film.

According to this configuration, the insulating film can continuously cover the side surfaces of the multiple-layered insulating film. Thus, a dielectric breakdown occurred in the semiconductor device can be inhibited with a further improved efficiency.

In the present invention, it may be configured that a film thickness of the insulating film in vicinity of the interface between the first insulating layer and the second insulating layer is larger than a film thickness of the insulating film in vicinity of the interface between the second insulating layer and between the third insulating layer.

By having the configuration, in which the film thickness of the insulating film in vicinity of the interface between the first insulating layer and the second insulating layer is larger than the film thickness of the insulating film in vicinity of the interface between the second insulating layer and the third insulating layer in the present invention, the vicinity of the interface between the first insulating layer and the second insulating layer can be definitely covered even in the case of exhibiting a poor adhesion between the first insulating layer and the second insulating layer, thereby preventing a peeling off that may be otherwise occurred between the first insulating layer and the second insulating layer.

In the present invention, it may be configured that the film thickness of the insulating film is gradually reduced as a distance from a bottom of the multiple-layered insulating film is increased.

By having the configuration, in which the film thickness of the insulating film is gradually reduced as increasing the distance from the bottom of the multiple-layered insulating film, the vicinity of the interface between the first insulating layer and the second insulating layer can be surely covered even in the case of having a poor adhesion between the first insulating layer and the second insulating layer, thereby preventing a peeling off that may be otherwise occurred between the first insulating layer and the second insulating layer.

In the present invention, it may be configured that the insulating film contains a material that is similar type to the material of the first insulating layer.

According to such configuration, the adhesion of insulating layer with the first insulating film is improved. Thus a dielectric breakdown occurred in the semiconductor device can be inhibited with an improved efficiency. Further, the mechanical strength thereof can also be improved.

In the present invention, it may be configured that specific dielectric constant of the second insulating layer is equal to or less than 3.5.

According to such configuration, a parasitic capacitance of the semiconductor device can be reduced, thereby providing an inhibition to a generation of an interconnect delay. Here, since the insulating film is provided in the configuration of the present invention, the dielectric breakdown of semiconductor device may be inhibited even if the specific dielectric constant of the second insulating layer is equal to or less than 3.5.

In the present invention, it may be configured that the electric conductor includes a layer of copper or copper alloy, and a barrier metal film that covers a bottom surface and a side surface of the layer of copper or copper alloy.

According to such configuration, a diffusion of copper element from the metallic copper or the copper alloy layer can be inhibited. Here, since the insulating film is provided in the configuration of the present invention, the dielectric breakdown between the barrier metal film and the above-described interfaces can be inhibited.

In the present invention, it may be configured that a fourth insulating layer that is provided on the multiple-layered insulating film is further included.

According to such configuration, further improvement in the insulating performance of the semiconductor device can be presented.

In the present invention, it may be configured that a the insulating film contains a material that is similar type to the material of the first insulating layer and the fourth insulating layer, and is formed so as to contact with the first insulating layer and the fourth insulating layer.

According to such configuration, the adhesion of the insulating film with the first insulating layer and the fourth insulating layer can be improved. Thus a dielectric breakdown occurred in the semiconductor device can be inhibited with an improved efficiency. Further, the mechanical strength can also be improved.

In the present invention, it may be configured that an interconnect is provided in the multiple-layered insulating film, and the electric conductor composes at least a portion of the interconnect.

According to such configuration, the dielectric breakdown between interconnects can be inhibited in the case of having a reduced distance between the interconnects.

In the present invention, it may be configured that the semiconductor device further comprises an interconnect that is provided between the semiconductor substrate and the multiple-layered insulating film, and the electric conductor composes at least a portion of a via plug that is coupled to the interconnect.

According to such configuration, the dielectric breakdown between via plugs can be inhibited in the case of having a reduced distance between the via plugs.

Further, in the present invention, it may be preferably configured that the inside of the insulating film is formed to be a forwardly tapered shape.

When the shape of the inner surface of the insulating film is not forwardly tapered, it is difficult that the source material composing the electric conductor is reached to the lower portion of the inner surface of the insulating film (portion in the side of the semiconductor substrate) and the source material is deposited on the lower portion of the inner surface of the insulating film in the formation of the electric conductor. Thus voids may be generated during the formation of the electric conductor. On the contrary, the source material composing the electric conductor can be easily reached to the lower portion of the inner surface of the insulating film (portion in the side of the semiconductor substrate) and the source material can be easily deposited on the lower portion of the inner surface of the insulating film by presenting a forwardly tapered shape to the inner surface of the insulating film to form the inner surface thereof as the inclined plane. Having this configuration, the generation of voids in the formation of the electric conductor can be prevented.

In the present invention, it may be configured that the forming the insulating film includes providing an adhesion of a portion of the first insulating layer onto a side surface of the opening when the opening is formed, by sputter etching a portion of the first insulating layer.

According to such method, the insulating film can be formed on the side surfaces of the opening with a simple and easy process. Thus a dielectric breakdown occurred in the semiconductor device can be effectively inhibited.

In the present invention, it may be configured that the providing the adhesion of a portion of the first insulating layer includes sputter etching utilizing an inert gas, at a gas pressure of equal to or lower than 1 mmTorr.

According to such method, the film quality of the insulating film can be improved. Thus a dielectric breakdown occurred in the semiconductor device can be effectively inhibited.

In the present invention, it may be configured that the forming the insulating film includes: forming a bottom surface of the opening being included within the first insulating layer by sputter etching a portion of the first insulating layer; and forming the opening extending through the multiple-layered insulating film by partially removing the first insulating layer right under the bottom surface of the opening.

According to such method, the first insulating layer is remained right under the bottom surface of the opening after the sputter etching. Thus, a damage occurred to the structure provided in the lower portion of the first insulating layer during the sputter etching can be inhibited.

In the present invention, it may be configured that the forming the insulating film includes providing an adhesion of a portion of the first insulating layer onto a side surface of the opening when the opening is formed, by conducting an anisotropic dry etching of a portion of the first insulating layer.

According to such method, the insulating film can be formed on the side surfaces of the opening with a simple and easy process. Thus a dielectric breakdown occurred in the semiconductor device can be effectively inhibited.

In the present invention, it may be configured that the providing the adhesion of a portion of the first insulating layer includes conducting an anisotropic dry etching by employing an etchant gas containing fluorocarbon gas and nitrogen gas or hydrogen gas.

According to such method, the film quality of the insulating film can be improved. Thus, the dielectric breakdown occurred in the semiconductor device can be effectively inhibited.

In the present invention, it may be configured that the forming the multiple-layered insulating film includes forming the first insulating layer having a carbon concentration of equal to or higher than 10 atomic %

According to such method, a portion of the first insulating layer can be easy adhered to the side surfaces of the opening in the anisotropic dry etching. Thus, the film quality of the insulating film can be improved. As a result, the dielectric breakdown occurred in the semiconductor device can be effectively inhibited.

Preferable embodiments according to the present invention will be described as follows in further detail, in reference to the annexed figures. In all figures, identical numeral is assigned to an element commonly appeared in the figures, and the detailed description thereof will not be presented.

First Embodiments

Figure 6:
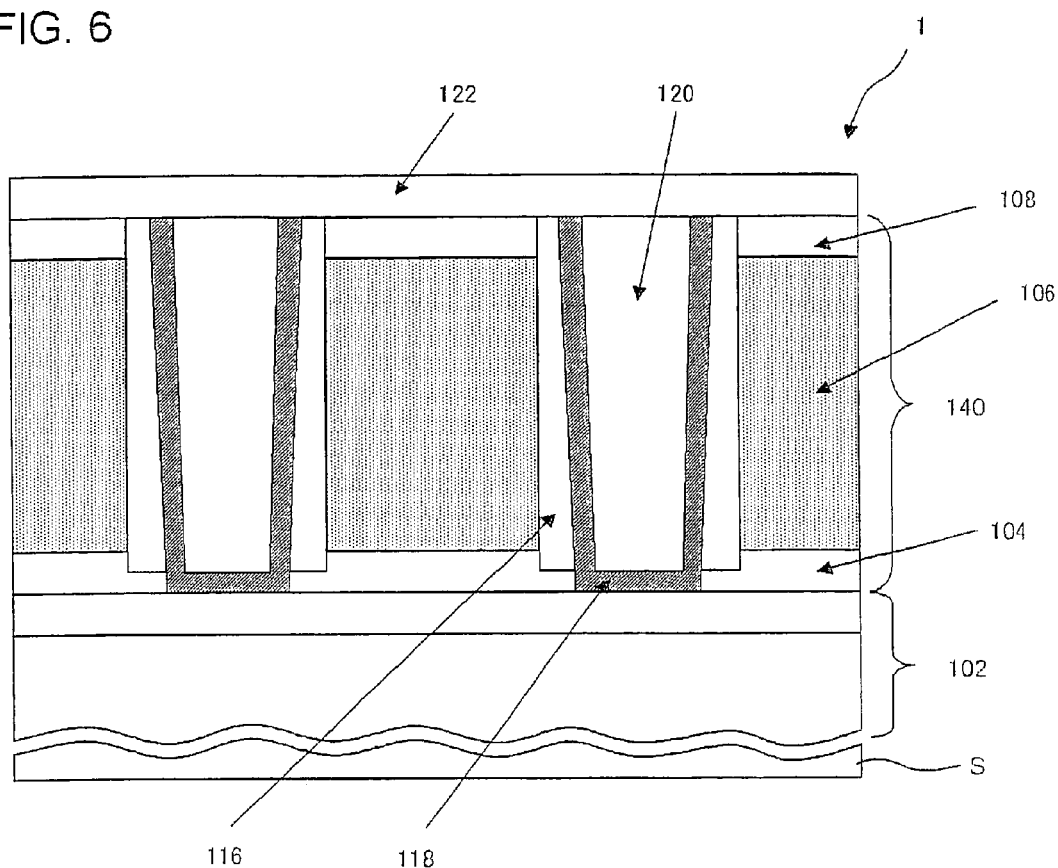
FIG. 6 is a cross-sectional view, useful for describing the interconnect structure of the semiconductor device according to embodiment 1.

FIG. 6 is a cross-sectional view useful for describing the semiconductor device of the present embodiment.

A semiconductor device 1 of the present embodiment comprises a semiconductor substrate S, an interlayer insulating film 102 formed on the semiconductor substrate and a multiple-layered insulating film 140 provided on the interlayer insulating film 102. Such semiconductor device 1 comprises electric conductors (Cu interconnect),being provided so as to extend through the multiple-layered insulating film 140, and each including a Cu film 120 and a barrier metal film 118. The barrier metal film 118 is provided so as to cover side surfaces and a bottom surface of the Cu film 120. Here, the Cu film 120 may be a Cu alloy film, in order to improve the electromigration (EM) resistance This semiconductor device comprises an insulating film 116 provided between the multiple-layered insulating film 140 and the electric conductor (Cu film 120 and barrier metal film 118).

The multiple-layered insulating film 140 comprises an etch stop film 104 (first insulating layer), a low dielectric constant insulating film 106 (second insulating layer), being provided on the etch stop film 104 and having lower dielectric constant than the dielectric constant of the etch stop film 104, and a hard mask film 108 (third insulating layer), being provided on the low dielectric constant insulating film 106 and having higher dielectric constant than the dielectric constant of the low dielectric constant insulating film 106.

The insulating film 116 isolates the interface of the etch stop film 104 and the low dielectric constant insulating film 106 from the electric conductor (Cu film 120 and barrier metal film 118). The insulating film 116 also isolates the interface of the low dielectric constant insulating film 106 and the hard mask film 108 from the electric conductor (Cu film 120 and barrier metal film 118). A copper diffusion protection film 122 (fourth insulating layer, SiCN film) is formed on the hard mask film 108 and on the Cu film 120.

Further, the insulating film 116 is provided to cover the regions of the side surfaces of the barrier metal film 118 except the vicinity of the interlayer insulating film 102. More specifically, a portion of the etch stop film 104 is provided right under the insulating film 116. In other words, the insulating film 116 has a relationship with the multiple-layered insulating film 140 that the insulating film 116 extends through the low dielectric constant insulating film 106 and the hard mask film 108, and is embedded within at least a portion of the etch stop film 104. Further, the film thickness of the insulating film 116 in vicinity of the interface between the etch stop film 104 and the low dielectric constant insulating film 106 is larger than the film thickness of the insulating film 116 at the interface between the low dielectric constant insulating film 106 and the hard mask film 108. In addition, the insulating film 116 is composed of a material that is similar to the material of the etch stop film 104 and the material of the copper diffusion protection film 122, and is in contact with the etch stop film 104 and the copper diffusion protection film 122. Further, the insulating film 116 is formed to cover the periphery of the barrier metal film 118 of the electric conductor, and the inner diameter of the insulating film 116 is gradually decreased along the thickness direction from the side of the surface of the multiple-layered insulating film 104 (side of hard mask film 108) to the side of the semiconductor substrate S. In other words, the inner surface of the insulating film 116 is a forwardly tapered-shaped.

Here, the low dielectric constant insulating film 106 may be formed from a material having a dielectric constant equal to or less than 3.5. The low dielectric constant insulating film may be formed by employing, for example, methyl polysiloxane, organo-silicate glass, porous methyl polysiloxane, porous organo-silicate glass and the like, as well as hydrogenated polysiloxane. As such, the use of the material having a dielectric constant of equal to or lower than 3.5 for the low dielectric constant insulating film 106 provides a reduction in the parasitic capacitance between copper interconnects.

The method for manufacturing the semiconductor device of the present embodiment will be described in reference with the annexed figures.

FIGS. 1 to 5 are cross-sectional views, illustrating the method for manufacturing the semiconductor device 1 shown in FIG. 6. Illustration of the semiconductor substrate S is not presented in FIG. 1 to FIG. 5.

First, as shown in FIG. 1, an etch stop film 104 composed of SiCN film, a low dielectric constant insulating film 106 composed of hydrogenated polysiloxane film and a hard mask film 108 composed of SiO$_2$ film are formed in sequence on the interlayer insulating-film 102 that has been formed on the semiconductor substrate by a well-known method to form a multiple-layered insulating film 140.

Continuously, an anti-reflection coating (ARC) film 110 and a photo resist film 112 are sequentially formed on the multiple-layered insulating film 140, and a desired pattern is formed in the photo resist film 112 by a known lithography technology.

Figure 2:
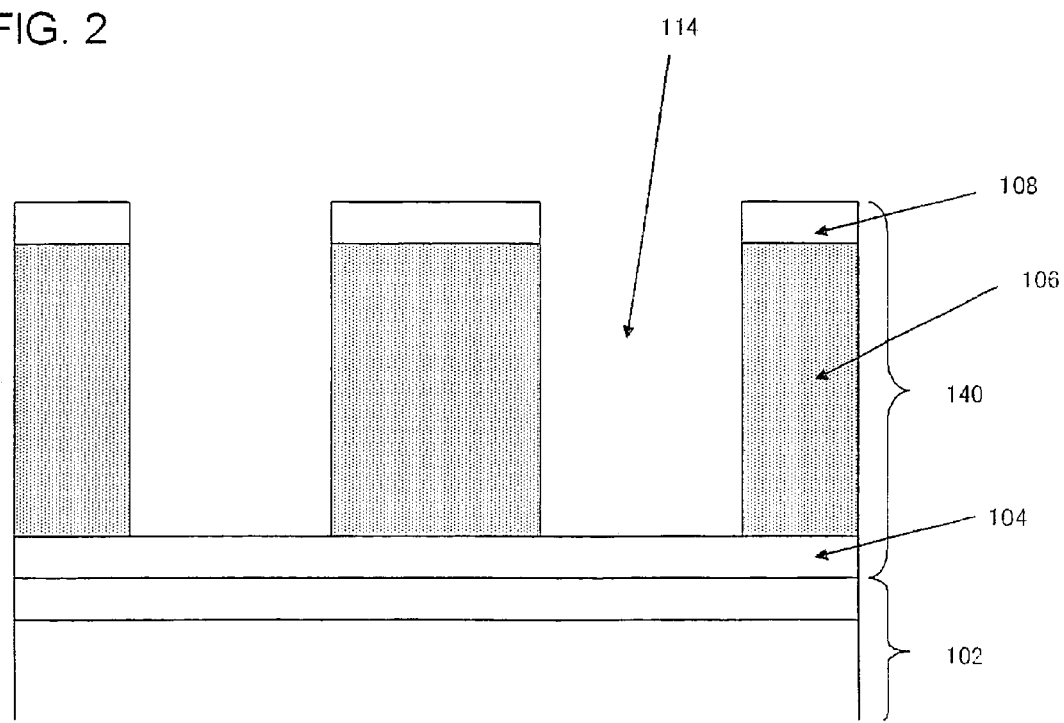
FIG. 2 is a cross-sectional view, useful for describing the method for manufacturing the semiconductor device according to embodiments 1 and 3.

Next, as shown in FIG. 2, the ARC film 110, the hard mask film 108 and the low dielectric constant insulating film 106 are sequentially etched through the mask of the patterned photo resist film 112 to form openings 114. Concerning the etch stop film 104, a film composed of a material that is capable of providing a certain selectivity of etch rates with an etch gas (i.e., providing larger selectivity) for etching the low dielectric constant insulating film 106 (hydrogenated polysiloxane film) may be selected for the etch stop film 104 (e.g., SiCN film). Thus, a leading edge of the opening 114 formed via the etching is stopped at the interface of the low dielectric constant insulating film 106 with the etch stop film 104. Sequentially, the photo resist film 112 and the ARC film 110 are stripped via an ashing process, and the residues thereof are removed with a stripping solution.

Figure 3:
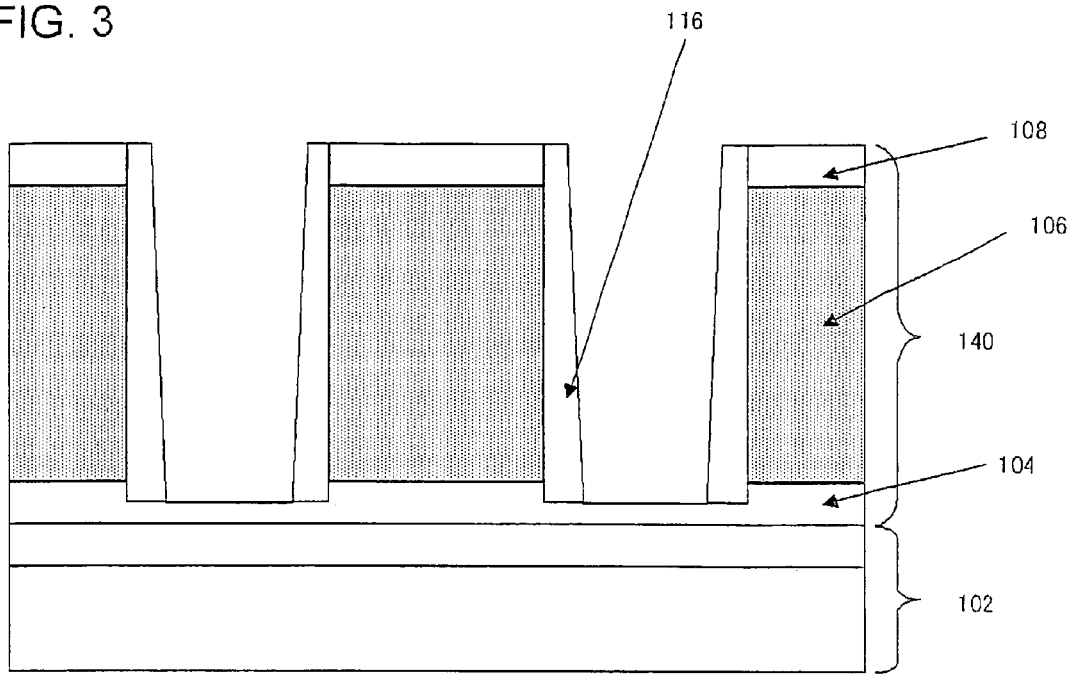
FIG. 3 is a cross-sectional view, useful for describing the method for manufacturing the semiconductor device according to embodiment 1.

Further, as shown in FIG. 3, portions of the etch stop film 104 exposed onto the bottoms of the openings 114 are sputter etched in a CVD or PVD chamber within an inert gas atmosphere to etch the portions of the etch stop film 104 onto the bottoms of the openings 114, and the material composing the etch stop film 104 (e.g., SiCN film) is adhered onto the side walls of the openings 114 to form insulating films 116 (protective films).

Here, when the sputter etch is conducted, it is preferable to design that the portions of the etch stop film 104 on the bottoms of the openings 114 should be remained after the sputter etch process, because, if the portions of the etch stop film 104 are completely etched off (i.e., if the opening 114 extends through the etch stop film 104) damages are occurred into the structures such as the underlying metal layer (not shown) during the etching process via the sputter etch, leading to the problem of increasing the resistance of the metal layer (not shown) and the like.

Process conditions for the sputter etch in this case may be, for example: within an atmosphere of an inert gas such as Ar gas; an upper electric coil at 1 MHz or higher and 200 W or higher; substrate bias with a power of 200 W or higher at a frequency of 13.56 MHz; and the gas pressure of 1 mm Torr or lower. In particular, the portions of the insulating film (etch stop film 104) on the bottoms of the openings 114 can be sputtered with higher efficiency, by conducting a sputter etch at a lower pressure of the gas pressure as equal to or lower than 1 mmTorr.

The insulating film 116 that formed by the sputter etch covers the exposed portions in the opening 114 of the interface between the low dielectric constant insulating film 106 and the hard mask film 108, and covers the exposed portions in opening 114 of the interface between the low dielectric constant insulating film 106 and interface of etch stop film 104. Since the insulating film 116 is formed by the sputter etch process, it is easy to deposit films in vicinity of the film to be sputtered. More specifically, the insulating film 116 has a geometry, in which the film thickness is gradually reduced as increasing the distance from the bottom of the opening.

Figure 4:
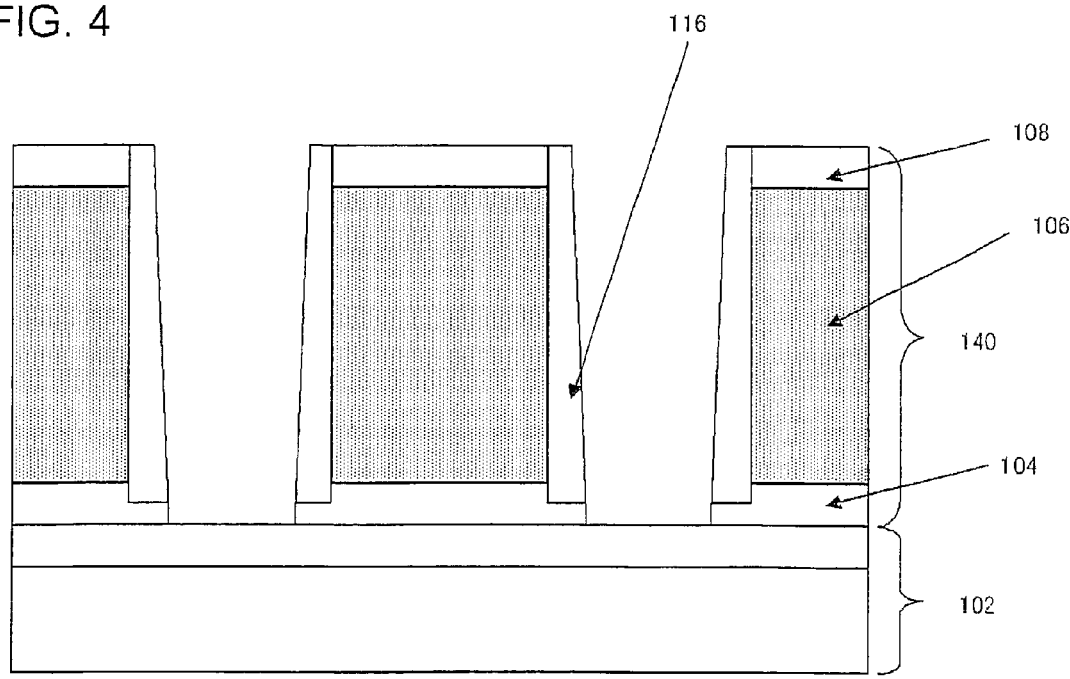
FIG. 4 is a cross-sectional view, useful for describing the method for manufacturing the semiconductor device according to embodiment 1.

Next, as shown in FIG. 4, the residual etch stop film 104 remained right under the bottoms of the openings 114 are removed via an anisotropic etchback. This provides a situation of the opening 114 that the opening 114 extends through the multiple-layered insulating film 140. Since the etchback of anisotropic is conducted in this occasion, the insulating film 116 formed in the side wall of the opening 114 is remained as being seldom etched.

Figure 5:
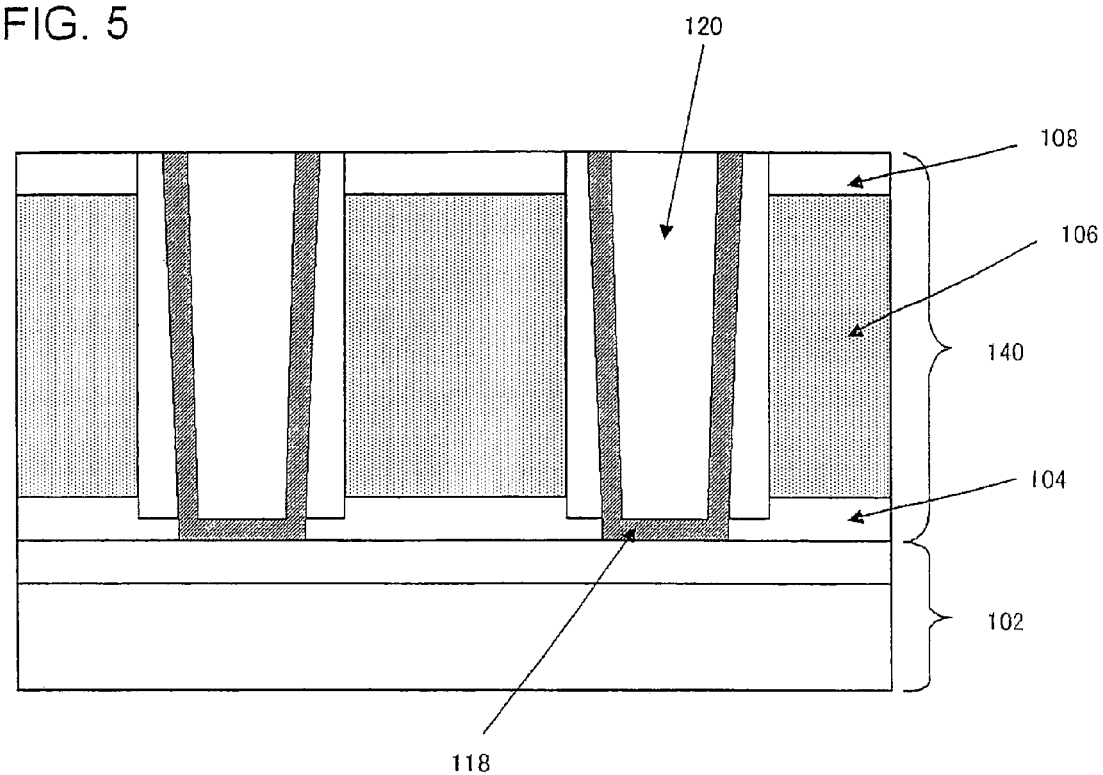
FIG. 5 is a cross-sectional view, useful for describing the method for manufacturing the semiconductor device according to embodiment 1.

Next, as shown in FIG. 5, multi-layered films comprising a barrier metal film 118 (Ta/TaN film) and a seed Cu film (not shown) is formed on the entire surfaces of the bottom surfaces and the side surfaces of openings 114. Continuously, Cu films 120 are formed via a metal plating process on the seed Cu film. Further, unwanted portions of the barrier film 118 and the Cu film 120 formed on the hard mask film 108 are removed via a chemical mechanical polishing (CMP) to form Cu interconnects composing of the barrier metal film 118 and the Cu film 120.

Then, as shown in FIG. 6, a copper anti-diffusion film 122 composed of SiCN film (Cu diffusion barrier film) is formed on the entire surfaces of the hard mask film 108, barrier metal film 118 and the Cu film 120.

Advantageous effects obtained by employing the interconnect structure of the semiconductor device according to the present embodiment will be described as follows.

According to the semiconductor device 1 of the present embodiment, an isolation voltage between the adjacent Cu interconnects can be improved. More specifically, the insulating film 116 is provided so as to isolate the Cu interconnect composed of the barrier metal film 118 and the Cu film 120 from the linear interface between the low dielectric constant insulating film 106 and the hard mask film 108. In addition, the insulating film 116 is provided so as to isolate the Cu interconnect composed of the barrier metal film 118 and the Cu film 120 from the linear interface between the low dielectric constant insulating film 106 and the etch stop film 104. Thus, the dielectric breakdown that is easy to be occurred at the interface between the insulating layers can be effectively inhibited. As a result, the isolation voltage between the adjacent Cu interconnects can be improved.

Further, according to the semiconductor device of the present embodiment, the adhesive strength between the insulating layers is improved. More specifically, since the insulating film 116, the etch stop film 104 and the copper diffusion protection film 122 are composed of the same material (SiCN film), the adhesion of the insulating film 116 with the etch stop film 104 and the adhesion of insulating film 116 with the copper diffusion protection film 122 can be enhanced, thereby providing an improved adhesive strength between insulating layers.

The barrier metal film 118 is generally deposited via a physical vapor deposition (PVD) process, and when the shape of the inner surface of the insulating film is not forwardly tapered, or for example, is a vertical surface normal to the semiconductor substrate S, it is difficult that metallic molecules composing the barrier metal film 118 are reached to the lower portion of the inner surface of the insulating film 116 (proximal portion of the interlayer insulating film 102) and the metallic molecules are deposited on the lower portion of the inner surface of the insulating film 116 in the formation of the barrier metal film 118. Thus voids may be generated during the formation of the barrier metal film 118.

On the contrary, in the present embodiment, metallic molecules composing the barrier metal film 118 can be easily reached to the lower portion of the inner surface of the insulating film 116 (proximal portion of the interlayer insulating film 102) and the metallic molecules can be deposited on the lower portion of the inner surface of the insulating film 116 during the formation of the barrier metal film 118 by presenting a forwardly tapered shape to the inner surface of the insulating film 116 to form the inner surface thereof as the inclined plane. Having this configuration, the generation of voids in the formation of the barrier metal film 118 can be prevented.

In other words, according to the semiconductor device 1 of the present embodiment, the semiconductor device exhibiting an improved manufacturing stability can be obtained.

Further, in the present embodiment, the insulating film 116 has a geometry, in which the film thickness is gradually reduced as increasing the distance from the etch stop film 104, the film thickness of the insulating film 116 at the interface between the etch stop film 104 and the low dielectric constant insulating film 106 is larger than the film thickness of the insulating film 116 at the interface between the low dielectric constant insulating film 106 and the hard mask film 108.

Here, a surface treatment such as a plasma treatment over the surface of the low dielectric constant insulating film 106 can be carried out to enhance the adhesion of the low dielectric constant insulating film 106 with the hard mask film 108, so that an improved adhesion of the low dielectric constant insulating film 106 with the hard mask film 108 can be presented.

On the other hand, the adhesion of the etch stop film 104 composed of the SiCN film or the like with the low dielectric constant insulating film 106 composed of a material having a dielectric constant of equal to or lower than 3.5 is poor, and in particular, when the low dielectric constant insulating film 106 is composed of a material having a dielectric constant of equal to or lower than 2.5, the adhesion of the interface between the etch stop film 104 and the low dielectric constant insulating film 106 is reduced, and thus the possibility of causing the breakdown at the aforementioned interface is increased when, for example, TDDB testing is conducted.

Although it is expected that a surface treatment such as a plasma treatment over the etch stop film 104 is conducted in order to improve the adhesion of etch stop film 104 with low dielectric constant insulating film 106 here, it may often be the case that the adhesion of the etch stop film 104 composed of SiCN film with the low dielectric constant insulating film 106 is not improved even if the surface treatment is conducted over the etch stop film 104.

To solve the problem, the film thickness of the insulating film 116 at the interface between the etch stop film 104 and the low dielectric constant insulating film 106 is selected to be larger than the film thickness of the insulating film 116 at the interface between the low dielectric constant insulating film 106 and the hard mask film 108, so that a peeling-off occurred between the etch stop film 104 and the low dielectric constant insulating film 106 can be surely prevented. For example, a failure occurred at the interface between the etch stop film 104 and the low dielectric constant insulating film 106 can be prevented, thereby providing an improved resistances.

Further, since the etch stop film 104 is partly remained, when the insulating film 116 is formed by adhering a portion of the etch stop film 104 to the side surface of opening 114 by the sputter etch process, a damage to the lower structure of the etch stop film 104 can be inhibited. As a result, the manufacturing stability for the semiconductor device can be improved.

Second Embodiment

Figure 10:
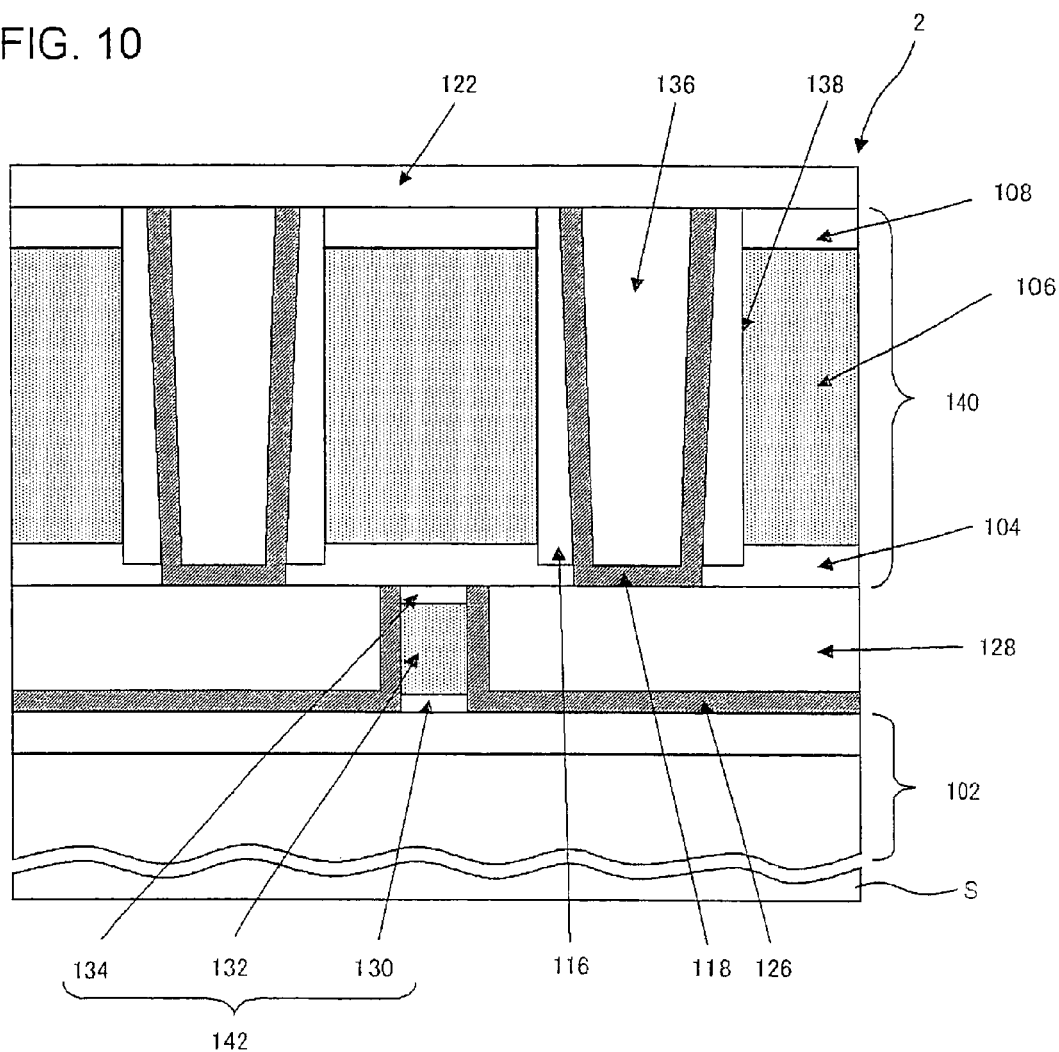
FIG. 10 is a cross-sectional view, useful for describing the configuration of the semiconductor device according to embodiment 2.

FIG. 10 is a cross-sectional view, illustrating a configuration of a semiconductor device 2 according to second embodiment.

The configuration of the semiconductor device 2 of the present embodiment is basically similar to that of the semiconductor device 1 of first embodiment, except that the insulating film 116 is applied to a Cu via plug (barrier metal film Cu film 136 and 118) formed on a Cu interconnect (Cu film 128 and barrier metal film 126).

In the semiconductor device 2 of the present embodiment, a Cu via plug is formed on the Cu interconnect. Further, the Cu interconnect is formed within a multiple-layered insulating film 142 comprising an etch stop film 130, a low dielectric constant insulating film 132 and a hard mask film 134. In FIG. 10, an insulating film 116, which separates a barrier metal film 118 of Cu via plug from an interface of the low dielectric constant insulating film 106 and hard mask film 108, is provided, similarly as in FIG. 6. This insulating film 116 isolates the interface of the low dielectric constant insulating film 106 and the etch stop film 104 from the barrier metal film 118 of Cu via plug. Here, concerning the interconnect structure of the Cu interconnects, an additional insulating film 116 as shown in FIG. 6 may also be separately formed.

According to the semiconductor device 2 of the present embodiment, the isolation voltage between the adjacent Cu via plugs can be improved. More specifically, the dielectric breakdown that is subject to be occurred at the interface between the insulating layers can be effectively inhibited by providing an insulating film that isolates the Cu via plug from the interface between the insulating layers instead of providing the Cu interconnect. As a result, the isolation voltage between the adjacent Cu via plugs can be improved. Further, advantageous effects that are obtainable by employing the configuration of first embodiment can also be achieved.

Third Embodiment

Figure 9:
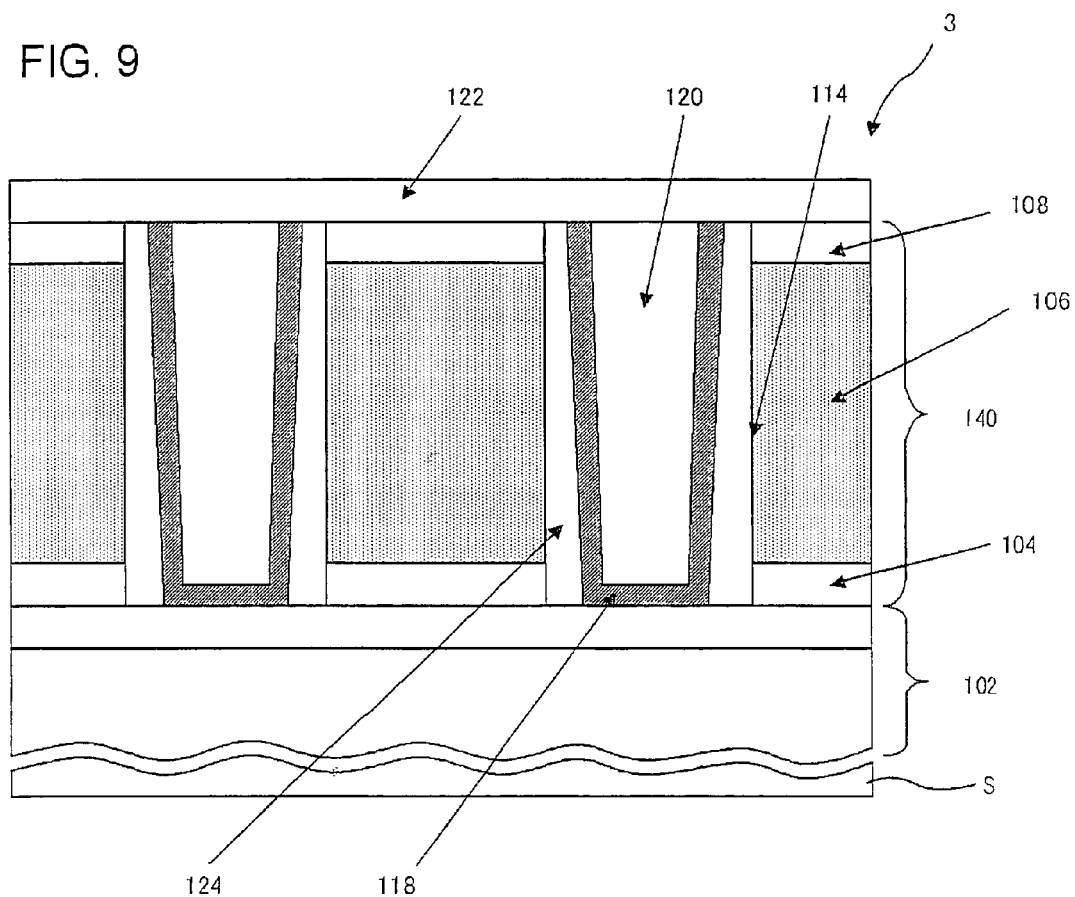
FIG. 9 is a cross-sectional view, useful for describing the configuration of the semiconductor device according to embodiment 3.

FIG. 9 is a cross-sectional view, illustrating a configuration of a semiconductor device 3 according to third embodiment.

The configuration of the semiconductor device 3 of the present embodiment is basically similar to that of the semiconductor device of first embodiment, except that the insulating film 124 extends through the multiple-layered insulating film 140 to come into contact with the interlayer insulating film 102. More specifically, unlikely in the configuration of first embodiment, in which a portion of the etch stop film 104 is provided right under the insulating film 116 in first embodiment, the configuration of the present embodiment includes no etch stop film 104 provided right under the insulating film 124.

The method for manufacturing the semiconductor device of the present embodiment will be described in reference with the annexed figures.

The method for manufacturing the semiconductor device 3 of the present embodiment is basically similar to that for the semiconductor device of first embodiment, except that the insulating film 124 is formed by an adhesion of the material composing the etch stop film 104 onto the side wall of the opening 114 caused in the anisotropic dry etching process, in stead of conducting the sputter etching of the etch stop film 104.

Figure 7:
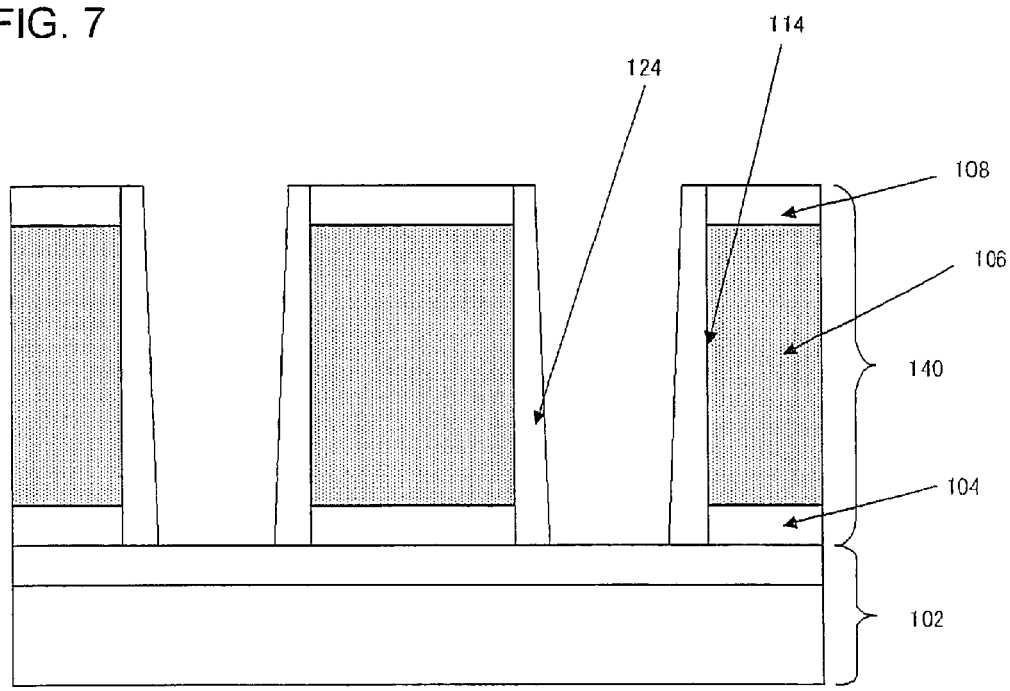
FIG. 7 is a cross-sectional view, useful for describing the method for manufacturing the semiconductor device according to embodiment 3.
Figure 8:
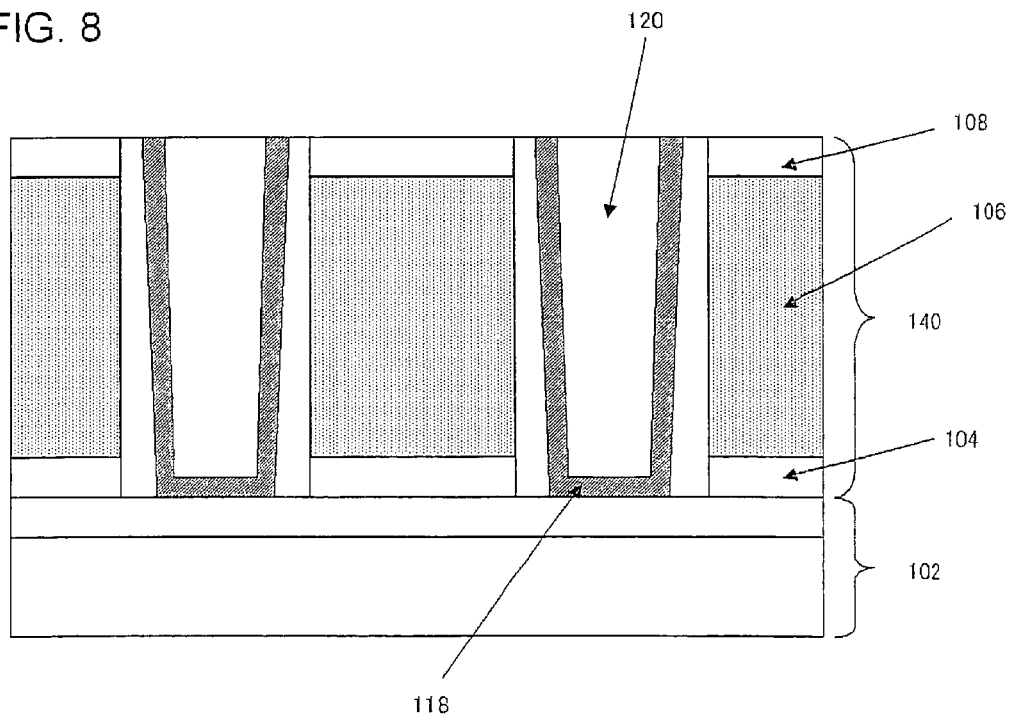
FIG. 8 is a cross-sectional view, useful for describing the method for manufacturing the semiconductor device according to embodiment 3.

FIG. 7 and FIG. 8 are cross-sectional views, illustrating the method for manufacturing the semiconductor device shown in FIG. 9. The process steps illustrated in FIG. 1 and FIG. 2 are first conducted for manufacturing the semiconductor device of the present embodiment, and the details thereof are not described, as these are common to that of first embodiment. Illustration of the semiconductor substrate S is not presented in FIG. 7 and FIG. 8.

An anisotropic dry etching of the etch stop film 104 is conducted as shown in FIG. 7, once the process shown in FIG. 2 is completed. In this occasion, an appropriate etch condition may be selected to provide an adhesion of the material composing the etch stop film 104 onto the side wall of the opening 114, thereby forming the insulating film 124.

The etching condition in this time may be, for example, a condition employing an etchant gas containing at least fluorocarbon gas, and nitrogen or hydrogen. Further, carbon concentration in the etch stop film 104 may also be increased for the purpose of providing an easy adhesion of the insulating film 124 (protective film) to the side wall in the etching process. For example, 10 atomic % or higher of the carbon concentration of the etch stop film 104 provides an easier adhesion of the insulating film 124 onto the side wall in the etching process.

Then, as shown in FIG. 8, a barrier metal film 118 and a seed Cu film (not shown) are sequentially formed on the entire surfaces of the bottom surface and the side surfaces of the opening 114. Continuously, a Cu film 120 is formed on the seed Cu film via a metallic plating process. Further, unwanted portions of the barrier film 118 and the Cu film 120 formed on the hard mask film 108 are removed via a chemical mechanical polishing (CMP) to form Cu interconnects composing of the Cu film 120 and the barrier metal film 118.

Then, as shown in FIG. 9, a copper anti-diffusion film 122 composed of SiCN film (Cu diffusion barrier film) is formed on the hard mask film 108 and the Cu film 120.

Advantageous effects obtained by employing the semiconductor device according to the present embodiment will be described as follows.

According to the semiconductor device of the present embodiment, an advantageous effect of providing an improved manufacturing stability for the semiconductor device is obtained, in addition to the advantageous effects of first embodiment. More specifically, since the insulating film 124 can be formed in the anisotropic dry etching for the etch stop film 104 after completing the etching of the hard mask film 108 and the low dielectric constant insulating film 106, any transition process for transferring the process to the sputter etch or the like is not required, thereby reducing the necessary process steps. Further, since the anisotropic dry etching can be carried out under a comparatively milder conditions in such configuration, a damage to the lower structure of the etch stop film 104 can be inhibited even if the etch stop film 104 is completely removed. As a result, the manufacturing stability for the semiconductor device is improved.

Fourth Embodiment

Figure 11:
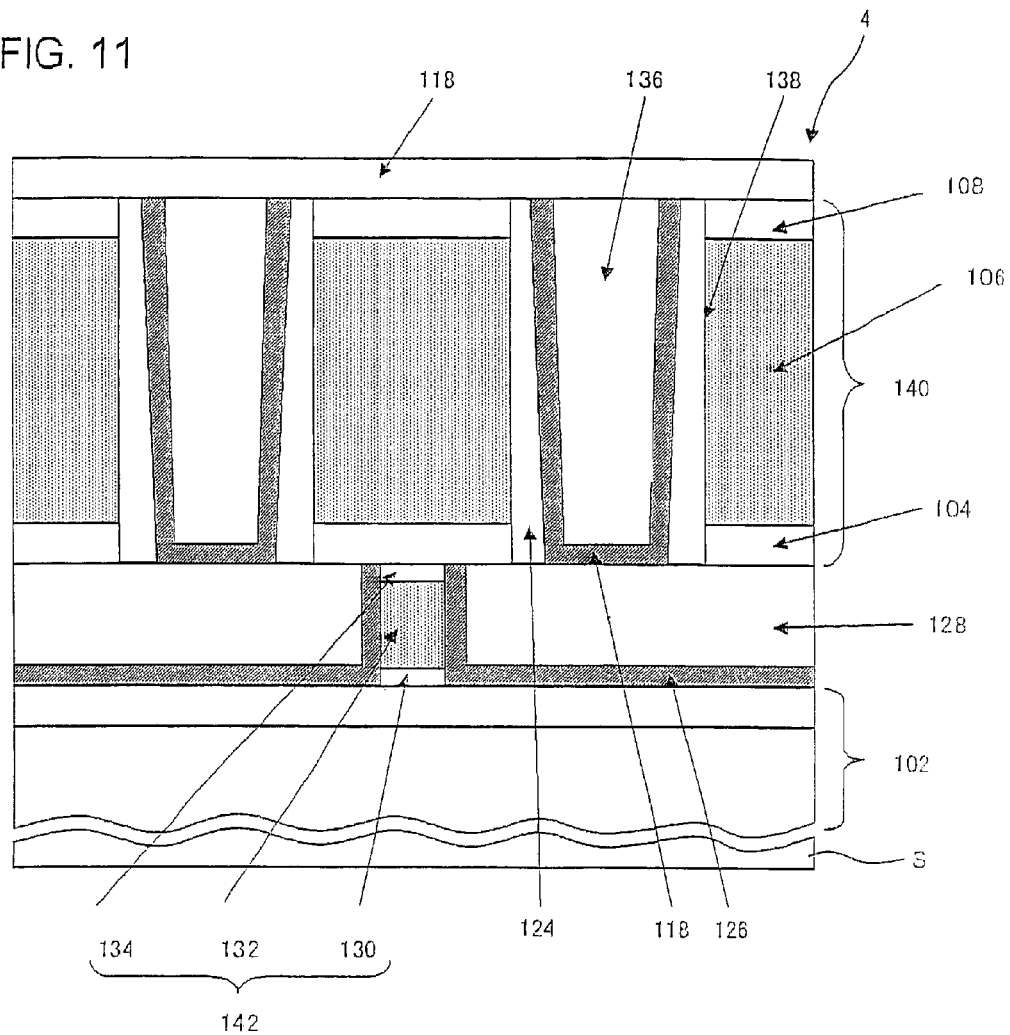
FIG. 11 is a cross-sectional view, useful for describing the configuration of the semiconductor device according to embodiment 4.
Figure 12A:
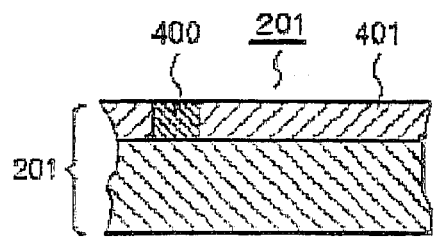
FIGS. 12A and 12B are cross-sectional views, each useful for describing the configuration of a conventional semiconductor device.
Figure 12B:
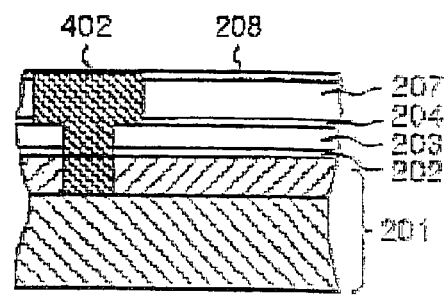

FIG. 11 is a cross-sectional view, illustrating a configuration of a semiconductor device 4 according to fourth embodiment. The configuration of the semiconductor device of the present embodiment is basically similar to that of the semiconductor device of third embodiment, except that the insulating film 124 is applied to a Cu via plug (barrier metal film Cu film 136 and 118) formed on a Cu interconnect (Cu film 128 and barrier metal film 126).

In the semiconductor device 4 of the present embodiment, a Cu via plug is formed on the Cu interconnect. Further, the Cu interconnect is formed within a multiple-layered insulating film 142 comprising an etch stop film 130, a low dielectric constant insulating film 132 and a hard mask film 134. In FIG. 11, an insulating film 124, which isolates the barrier metal film 118 of Cu via plug from an interface between the low dielectric constant insulating film 106 and the hard mask film 108, is provided, similarly as in FIG. 9. The insulating film 124 provides an isolation of the interface between the low dielectric constant insulating film 106 and the etch stop film 104 from the barrier metal film 118 of Cu via plug. Here, concerning the interconnect structure of the Cu interconnect, an insulating film 116 shown in FIG. 6 may also separately be formed.

According to the semiconductor device of the present embodiment, the isolation voltage between the adjacent Cu via plugs can be improved. More specifically, the dielectric breakdown that is subject to be occurred at the interface between the insulating layers can be effectively inhibited by providing an insulating film that isolates the Cu via plug from the interface between the insulating layers instead of providing the Cu interconnect. As a result, the isolation voltage between the adjacent Cu via plugs can be improved.

Further, advantageous effects that are obtainable by employing the configuration of first embodiment can also be achieved.

While the preferred embodiments of the present invention have been described above in reference to the annexed figures, it should be understood that the disclosures above are presented for the purpose of illustrating the present invention, and various configurations other than the above-described configurations can also be adopted.

For example, while the above-described embodiments describes the multiple-layered insulating film 140 as the structure formed by forming the etch stop film 104, the low dielectric constant insulating film 106 and the hard mask film 108 in sequence, it is not intended to particularly limit the scope of the invention thereto.

The structure of the multiple-layered insulating film 140 is not limited to a tri-layered structure, and may be a structure having four or more layers. In such case, the insulating film may be configured to cover all of the ends of the interfaces between these insulating layers to provide an effective inhibition to a short-circuit occurred by the dielectric breakdown.

Further, while a hydrogenated polysiloxane film is employed for the low dielectric constant insulating film 106 and a SiCN film is employed for the etch stop film 104 in the above-described embodiments, it is not limited thereto, and a methylsiloxane film may be employed for the low dielectric constant insulating film 106 and a SiC film containing methylsilane may be employed for the etch stop film 104, for example.

Since an organic group such as methyl group is contained at the interface of the low dielectric constant insulating film 106 and the etch stop film 104 in this case, the adhesion of the low dielectric constant insulating film 106 with the etch stop film 104 is particularly deteriorated. Even if methyl group in the etch stop film 104 is destroyed by conducting a surface treatment such as a plasma treatment over the etch stop film 104, methyl group in the low dielectric constant insulating film 106 is not destroyed, and therefore, the adhesion of the low dielectric constant insulating film 106 with the etch stop film 104 is not improved.

Here, the adhesion of the low dielectric constant insulating film 106 with the hard mask film 108 can be improved by conducting a surface treatment such as a plasma treatment over the low dielectric constant insulating film 106 to destroy methyl group in the surface of the low dielectric constant insulating film 106.

Thus, when a methylsiloxane film may be employed for the low dielectric constant insulating film 106 and a SiC film containing methylsilane may be employed for the etch stop film 104, it is particularly preferable to provide the film thickness of the insulating film 116 at the interface between the etch stop film 104 and the low dielectric constant insulating film 106 that is larger than the film thickness of the insulating film 116 at the interface between the low dielectric constant insulating film 106 and the hard mask film 108, like the above-described embodiment. Having this configuration, a peeling-off occurred between the etch stop film 104 and the low dielectric constant insulating film 106 can be surely prevented.

It is apparent that the present invention is not limited to the above embodiment, that may be modified and changed without departing from the scope and spirit of the invention.

The invention claimed is:

1. A method for manufacturing a semiconductor device, comprising:

forming on an upper portion of the semiconductor substrate a multiple-layered insulating film that includes a first insulating layer, a second insulating layer and a third insulating layer, said second insulating layer being provided on said first insulating layer and having lower dielectric constant than the dielectric constant of said first insulating layer, said third insulating layer being provided on said second insulating layer and having higher dielectric constant than the dielectric constant of said second insulating layer;

forming an insulating film by forming an opening, which extends through said multiple-layered insulating film, and covering a portion of a side surface of said opening in vicinity of an interface between said first insulating layer and said second insulating layer and a portion of a side surface of said opening in vicinity of an interface between said second insulating layer and said third insulating layer; and forming an electric conductor containing copper or copper alloy on a portion inside of said insulating film within said opening so as to extend through said multiple-layered insulating film.

2. The method according to claim 1, wherein said forming said insulating film includes providing an adhesion of a portion of said first insulating layer onto a side surface of said opening when said opening is formed, by sputter etching a portion of said first insulating layer.

3. The method according to claim 2, wherein said forming said insulating film includes: forming a bottom surface of said opening being included within said first insulating layer by sputter etching a portion of said first insulating layer; and forming said opening extending through said multiple-layered insulating film by partially removing the first insulating layer right under the bottom surface of said opening.

4. The method according to claim 1, wherein said forming said insulating film includes providing an adhesion of a portion of said first insulating layer onto a side surface of said opening when said opening is formed by conducting an anisotropic dry etching of a portion of said first insulating layer.

5. The method according to claim 4, wherein said providing the adhesion of a portion of said first insulating layer includes conducting an anisotropic dry etching by employing an etchant gas containing fluorocarbon gas and nitrogen gas or hydrogen gas.

6. The method according to claim 1, wherein said forming said electric conductor includes forming a barrier metal film on a portion inside of said insulating film within said opening, and forming a layer of copper or copper alloy on a portion inside of said barrier metal film within said opening.

7. The method according to claim 1, wherein the inside of said insulating film is formed to be a forwardly tapered shape.

* * * * *